United States Patent
Wilner et al.

(10) Patent No.: US 8,094,388 B1
(45) Date of Patent: Jan. 10, 2012

(54) REMOVABLE AND REPLACEABLE MODULAR OPTIC PACKAGE WITH CONTROLLED MICROENVIRONMENT

(75) Inventors: Doug Wilner, Sacramento, CA (US);
Chris Kruger, Lincoln, CA (US);
Gerald Williams, Applegate, CA (US);
Glen Thomson, Citrus Heights, CA (US)

(73) Assignee: Vortran Laser Technology, Inc., Sacramento, CA (US)

( * ) Notice: Subject to any disclaimer, the term of this patent is extended or adjusted under 35 U.S.C. 154(b) by 9 days.

(21) Appl. No.: 12/657,054

(22) Filed: Jan. 12, 2010

Related U.S. Application Data (60) Provisional application No. 61/204,937, filed on Jan. 12, 2009.

(51) Int. Cl.
*G02B 7/02* (2006.01)
*H01L 31/0203* (2006.01)

(52) U.S. Cl. .......................... 359/811; 257/433
(58) Field of Classification Search .................. 359/820, 359/669, 811; 385/76, 88, 92, 93, 94, 137; 372/34–36; 257/428, 432, 433, 434, 731
See application file for complete search history.

(56) References Cited

U.S. PATENT DOCUMENTS

| | | | |
|---|---|---|---|
| 5,265,115 A | 11/1993 | Amano | |
| 5,924,290 A | 7/1999 | Yoshino | |
| 6,027,256 A | 2/2000 | Nightingale et al. | |
| 6,069,907 A | 5/2000 | Chang | |
| 6,252,726 B1 | 6/2001 | Verdiell | |
| 6,756,581 B2 * | 6/2004 | Ohtomo et al. | .......... 250/231.13 |
| 6,801,561 B2 | 10/2004 | Kleinschmidt | |
| 6,973,106 B1 * | 12/2005 | Chaoui | .......................... 372/34 |
| 2005/0047731 A1 | 3/2005 | Hu et al. | |

FOREIGN PATENT DOCUMENTS

| | | |
|---|---|---|
| JP | 1010686 | 1/1989 |
| JP | 2308587 | 12/1990 |

* cited by examiner

*Primary Examiner* — Ricky Mack
*Assistant Examiner* — Tuyen Tra (57) ABSTRACT

The present invention pertains generally to a combination of optical elements integrated into a singular unit to perform one or more functional operations upon an electromagnetic radiation emission conveyed through said unit, and more particularly, a plurality of optical elements that are durably integrated into a modular optical package, wherein said modular optical package is adaptive to a releasable mounting mechanism and has the capability to maintain an independently controlled microenvironment. An electromagnetic radiation emission in introduced into the modular optical package through at least one ingress portal and upon modification by the internal optical elements, exits the modular optical package through at least one egress portal. A microenvironment is maintained within the enclosure of the modular optical package such that humidity, temperature, atmospheric composition, particulates, and out-gassing contaminants are controlled.

4 Claims, 9 Drawing Sheets

REMOVABLE AND REPLACEABLE MODULAR OPTIC PACKAGE WITH CONTROLLED MICROENVIRONMENT

PARENT CASE TEXT

This application claims the benefit under 35 U.S.C. 119(e) of U.S. provisional application Ser. No. 61/204,937 filed Jan. 12, 2009, which is incorporated by reference herein in its entirety.

BACKGROUND

Electromagnetic radiation sources are often employed in providing high energy light (i.e. coherent or laser light) to medical, scientific, and projection equipment. Such high energy light often requires modification of the wave pattern, focus, beam shape, or other attribute in order to render the light in an optimal usable form by the equipment. Modification of the high energy light is often performed by optical elements positioned intermediate to the electromagnetic radiation source and the equipment that subsequently will utilize that light in its respective operation. The optical elements act upon the light as it is emitted upon and/or passes through the elements, with such action occurring in serial and/or parallel optical modification steps.

Optical elements used in modifying high energy light are extremely sensitive to orientation, thermal stress, and contamination of the light receiving/emitting surfaces. Slight deviations in one or more of the optical elements conducting a light pathway will cause at the least a significant degradation in the desired modification of that light energy and in most cases will cause complete failure of the light energy to be conveyed through the modification pathway. Thermal stress have multiple deleterious effects on a modification pathway, including distancing and orientation shifts which have the potential to induce the slight deviation mentioned previously, as well as inducing physical stresses in the optical elements themselves which degrade the operational lifespan of the overall system. Further, an obstruction to the optical clarity of the optical elements themselves will degrade the performance of modification pathway. Obstructions to optical clarity typically include opaque occlusions (e.g. dust, dirt, and lint) which settle on the optical surfaces and performance degradants (e.g. out-gassing volatiles, aerosolized liquids, and condensing oils) which accumulate on the surface and modify the reflective, refractive, and/or transmission values thereof. The concept of controlling these degradants and minimizing them around and near the optics that control the pathway of the beam is especially important at wavelengths at 400 nm and shorter. These violet and ultraviolet wavelengths have a tendency to "plate these contaminants" onto the surfaces of the optical pathway and thus, severely degrading the transmission properties.

The need for optical modification pathways, along with the associated environmental control processing and hardware has led to current optoelectronic packages being large, expensive, and difficult to both manufacture and maintain. Furthermore, the costs associated with initial manufacture and subsequent maintenance has resulted in significant capital outlays necessary to procure such equipment. U.S. Pat. No. 6,027,256 to Nightingale et al., utilizes an enclosure containing a laser diode, related optics, thermo-electric cooling, and printed circuit board based control logic in a singular unit. U.S. Pat. No. 6,252,726 to Verdiell, is directed to a secondary enclosure contained within a primary enclosure wherein the secondary enclosure includes a laser diode, optical elements and is thermally conductive to the primary enclosure through a heat pipe/thermo-electric cooling cascade. U.S. Pat. No. 6,801,561 to Kleinschmidt employs a two-chamber enclosure in which a laser beam is altered in wavelength by passing differing environmental conditions within each respective chamber.

The aforementioned enclosed laser-based optical packages met to a limited degree the functionality requirements needed in an optical modification pathway. However, there remains an unmet need for an optical package that is a modular unit; which can be removed, repaired, and replaced easily; and, provides thermal control for managing a microenvironment contained therein once the modular package is installed in the complete system with the electromagnetic radiating source.

SUMMARY OF THE INVENTION

The present invention pertains generally to a combination of optical elements integrated into a singular unit to perform one or more functional operations upon an electromagnetic radiation emission conveyed through said unit, and more particularly, a plurality of optical elements that are durably integrated into a modular optical package, wherein said modular optical package is adaptive to a releasable mounting mechanism and has the capability to maintain an independently controlled microenvironment. An electromagnetic radiation emission in introduced into, and is an integral part of, the modular optical package through at least one ingress portal and upon modification by the internal optical elements, exits the modular optical package through at least one egress portal. Optical elements included in the modular optical package are selected from such devices as may have an effect on the qualities of a light source emitted into the modular optical package, including such elements as one or more lens, prisms, filters, gratings, mirrors, polarization enhancing elements, and the like. The modular optical package includes an enclosure that circumscribes the optical elements and provides both a means for mounting the modular optical package to a substrate, such as a base plate, and for providing a controlled microenvironment. Mounting mechanisms are releasable and allow the modular optical package to be removed and replaced while maintaining alignment geometries of the portals relative to the electromagnetic radiation emission source. A microenvironment is maintained within the enclosure of the modular optical package such that humidity, atmospheric composition, particulates, and out-gassing contaminants are controlled. The temperature within the enclosure is partially maintained while the modular optical package is removed from the substrate to as to protect the emission source from adverse temperature effects. Conversely, the temperature within the enclosure is specifically maintained when the modular optical package is mounted to the substrate.

In a first embodiment, the modular optical package includes at least one anamorphic prism pair to adjust the cross-sectional elliptical nature of a coherent light beam to a more circular value.

In a second embodiment, the modular optical package includes at least one semi-transparent window by which a predefined percentage of an incident coherent light beam is reflected to a photodiode sensor.

In a third embodiment, the modular optical package includes at least one temperature-measuring sensor by which the thermal aspect of the microenvironment within the modular optical package is dynamically controlled.

Other features and advantages of the present invention will become readily apparent from the following detailed description, the accompanying drawings, and the appended claims.

BRIEF SUMMARY OF THE FIGURES

The invention will be more easily understood by a detailed explanation of the invention including drawings. Accordingly, drawings that are particularly suited for explaining the inventions are attached herewith; however, it should be understood that such drawings are for descriptive purposes only and as thus are not necessarily to scale beyond the measurements provided. The drawings are briefly described as follows.

LIST OF REFERENCE NUMERALS

With regard to reference numerals used, the following numbering is used throughout the drawings: 8 modular optical package; 10 enclosure case; 11 enclosure base; 12 enclosure top; 14 top retention holes; 16 polarizing enhancing element; 18 pick-off window; 20 circularization element; 22 photodiode window; 24 dynamic feedback photodiode; 26 ingress portal; 28 egress portal; 30 enclosure space; 40 thermal control unit; 42 heating/cooling element; 44 thermal sensor; 46 thermal control circuit; 50 mounting block; 52 quick connect; 54 retention mechanism; 60 electromagnetic radiation source.

DETAILED DESCRIPTION

While the present invention is susceptible of embodiment in various forms, there is shown in the drawings and will hereinafter be described a presently preferred embodiment of the invention, with the understanding that the present disclosure is to be considered as an exemplification of the invention, and is not intended to limit the invention to the specific embodiment illustrated.

The inventors have identified a distinct advantage is employing a modular optical package concept by combining an emission device and the associated electronic circuitry (including one or more dynamic feedback sensors) to desired optical modification elements by which to alter the emission from the emission device. It is acknowledged in the art that optical alignment and stability against thermal and physical shock it of paramount importance in such devices where slight misalignment can greatly comprise the usefulness of an emission device. However, unlike prior art assemblies which have relied on massive, complex, and/or expensive combinations of entire drive and emission devices, the inventors have identified that a smaller assembly of key operational elements can be combined into a smaller, less complex, and less capitally intensive device. Further, the use of smaller modular package allows for the maintenance of a clean environment therein, thereby preventing issues with contamination of the functional pathway. Prevention of functional pathway contamination is particularly an issue when emission wavelengths are shorter, such as in the violet and ultraviolet wavelengths, whereby contaminate plating on the optical elements is particularly problematic.

Referring more specifically to the figures, for illustrative purposes the present invention is embodied in the apparatus generally shown in FIG. 1 through FIG. 3g.

Figure 1:
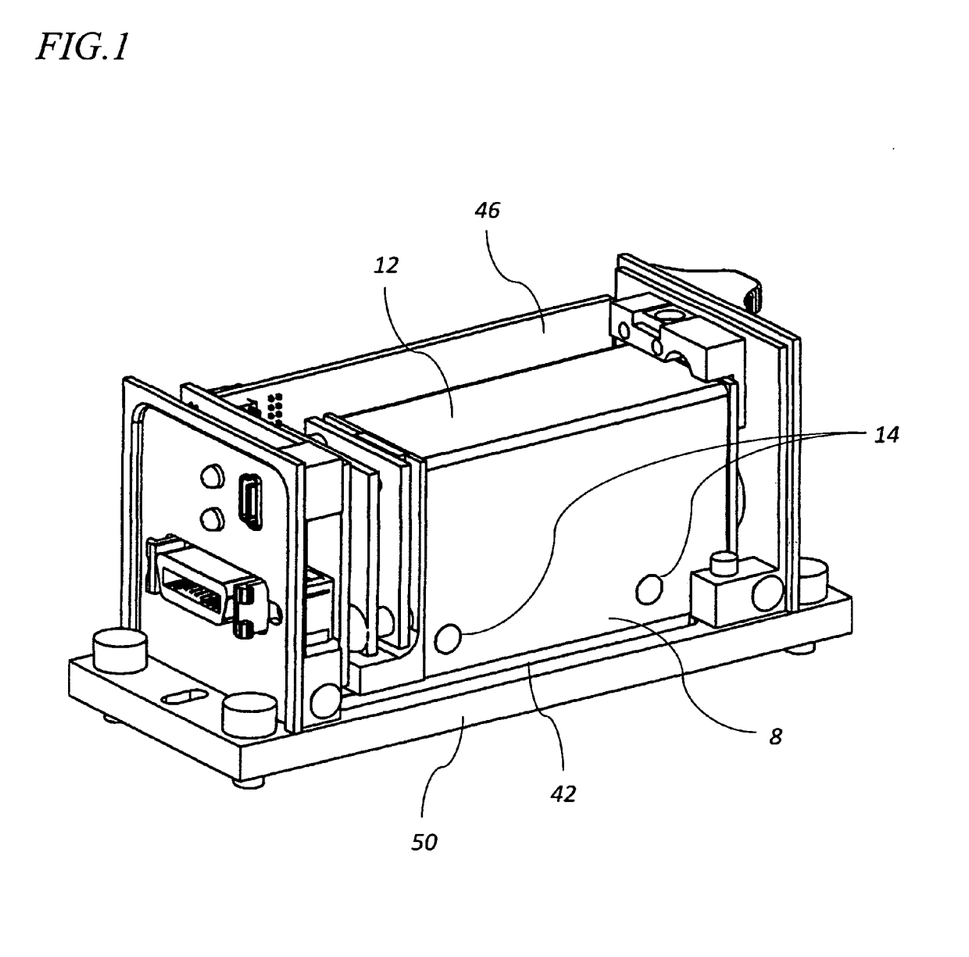
FIG. 1 is a top-down view of a modular optical package in accordance with the present invention wherein said modular optical package is mounted in a representative laser instrument.

FIG. 1 depicts a modular optical package in accordance with the present invention. A modular optical package 8 is formed from an enclosure case 12, an enclosure base 11, all of which in combination circumscribe a void or enclosure space 30. Enclosure space 30 may define a generally rectilinear shape as shown in FIG. 1, however, enclosure space 30 need only be sufficient for fitment of the desired optical elements and the modification light pathway performed thereby, therefore this space is not specifically constrained to a particular geometry.

The enclosure components may be composed of the same or differing materials, wherein the materials may be thermal conductive or thermal insulative in nature and the materials are composed of metals, metal alloy, ceramics, ceramic alloys, polymers, polymer alloys, and laminates thereof. Enclosure case 12 is specifically adapted for removal from enclosure base 11 during fabrication, alignment, repair, and replacement.

The combined enclosure case, comprising enclosure case 12 and an enclosure base 11, has at least two optically transparent windows contained within the outer periphery described thereby, wherein the windows form at least one ingress portal 26 formed by the collimating lens and at least one egress portal 28 formed by pick-off window 18. Ingress portal 26 will be oriented in an aspect of the periphery of the combined enclosure case such that an external electromagnetic radiation source 60 proximal to ingress portal 26 is optimally aligned to enter into through the portal an enter into the modification pathway described by the optical elements contained therein. Egress portal 28 will be oriented in an aspect of the periphery of the combined enclosure case such that electromagnetic radiation passed through the modification pathway described by the optical elements contained therein exits modular optical package 8 at a point suitable for subsequent utilization by a copending device (reference FIG. 7). It should be noted that the portals are defined based on functional attributes thereof, and as such, it is possible for ingress portal 26 and egress portal 28 to be the same window within modular optical package 8. The ingress portal 26 and egress portal 28 may be formed from optically transparent materials which allow transmission of the electromagnetic radiation without otherwise changing the nature of the radiation or one or both portals may include one or more sub-elements (not shown) which change one or more attributes of the transmitted radiation. In a particularly preferred embodiment, ingress portal 26 operates as a functional collimating lens for an external coherent light source and egress portal 28 is a non-altering clear lens which is operative as a pick-off window 18.

Referring again to FIG. 1, within the modular optical package 8, there may be contained one or more optical elements. For representative purposes, the preferred embodiment depicted in FIG. 2, includes optical elements to conduct a modification pathway in the form of a circularization element 20, a beam pick-off window 18 and an optional polarizing enhancement element 16. As a exemplar electromagnetic radiation (e.g. coherent laser light as generated by a laser emitting diode) enters ingress portal 26, it is first converted from an elliptical cross-sectional beam profile to a circular cross-sectional beam profile though the actions of a circularization element 20. Circularization of an elliptical beam is well known in the art, and can be performed by anamorphic prism pairs, singular multifaceted prisms, diffraction gratings, and astigmatism correcting lens. Prior art representing such means of circularization include U.S. Pat. Nos. 4,128,308 to McNaney; 4,410,237 to Veldkamp; 4,623,225 to Forkner; 4,627,690 to Fantone; 4,750,819 to Sugiki; and, 5,239,414 to Reno, each of which is incorporated in its entirety by reference.

Figure 2:
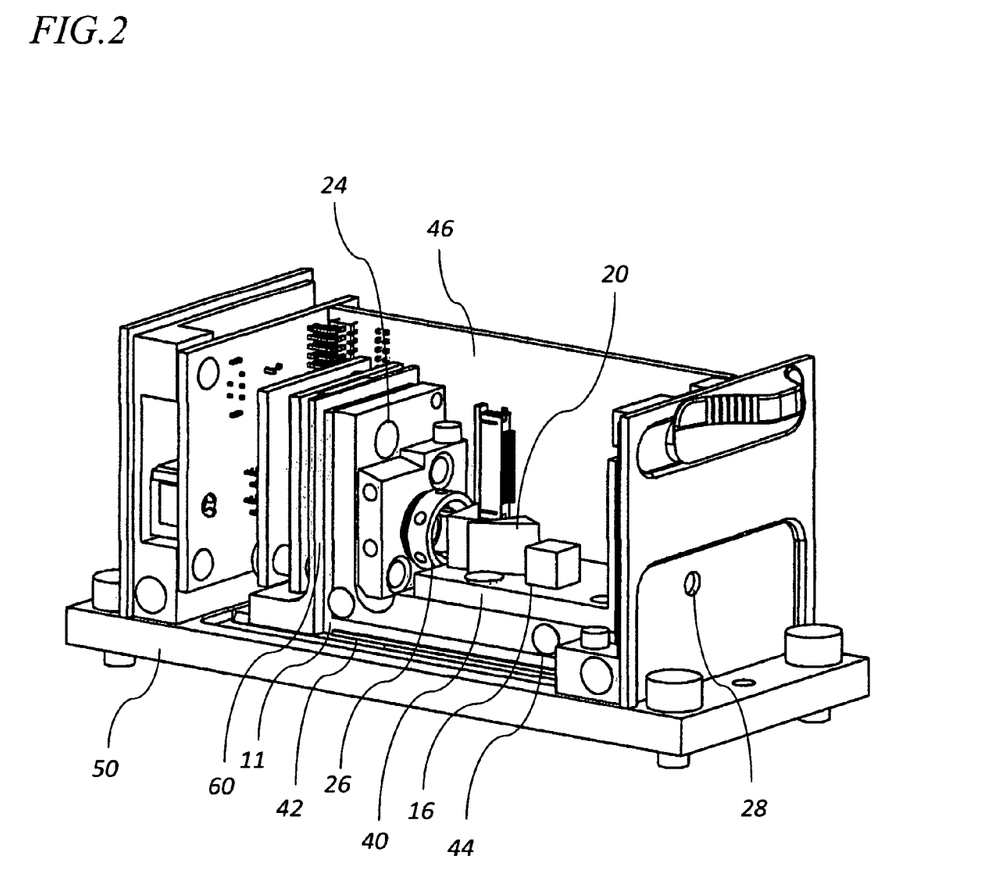
FIG. 2 is a perspective view of a modular optical package mounted in a representative laser instrument wherein a cover element has been removed.
Figure 3A:
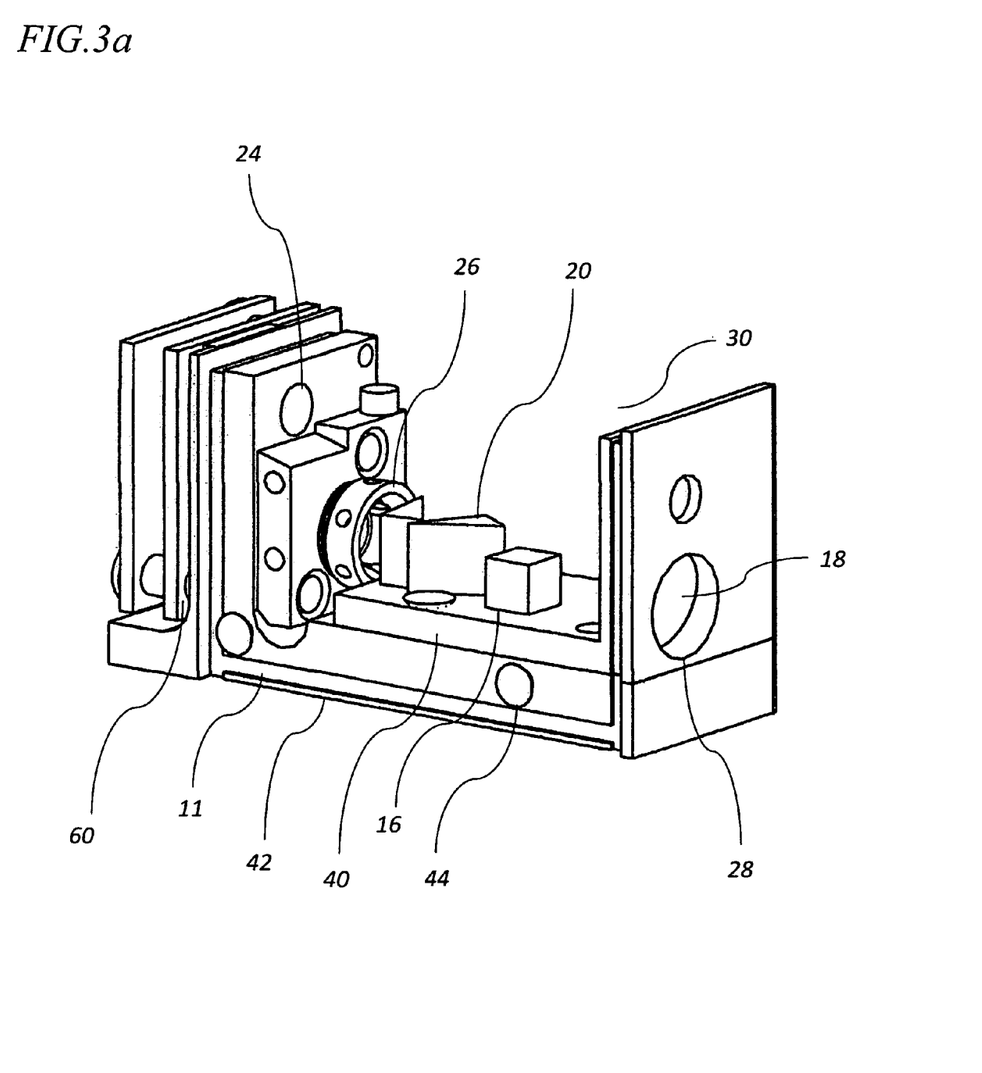
FIG. 3a is a perspective view of a modular optical package.
Figure 3B:
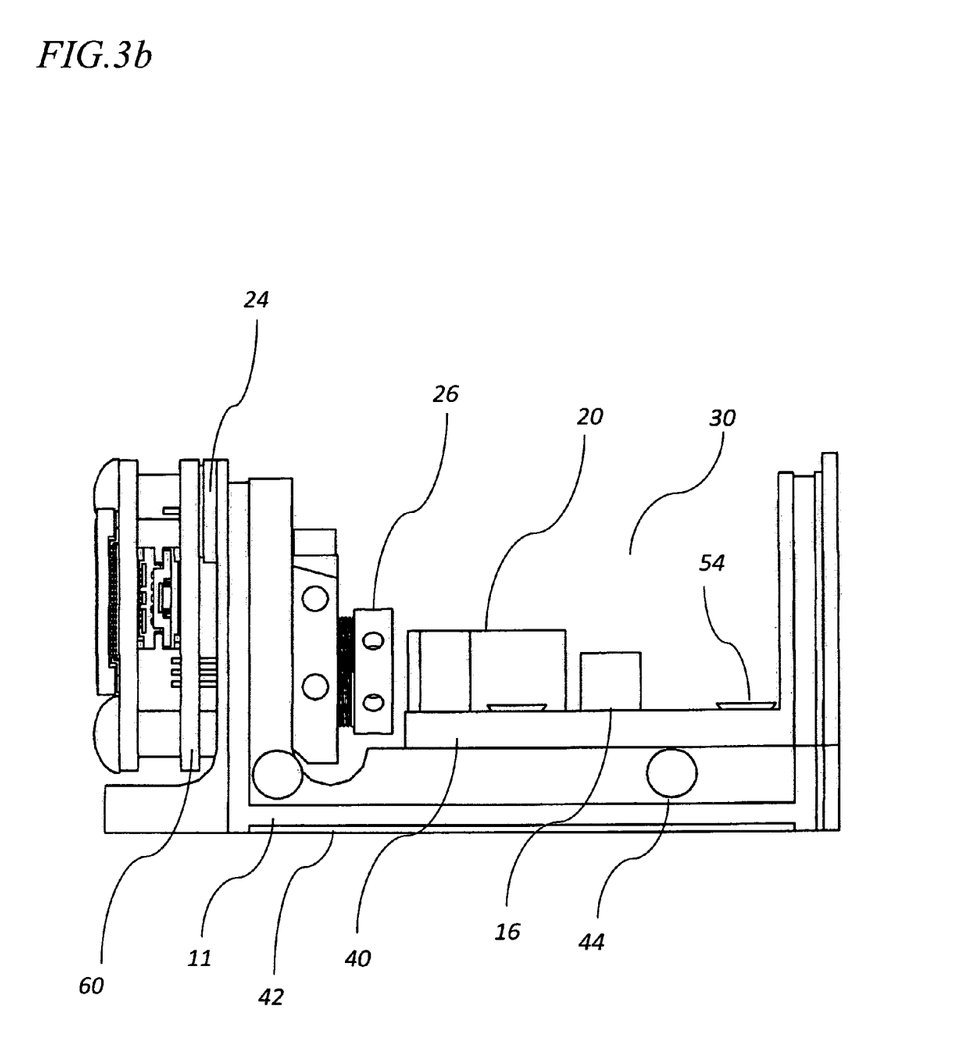
FIG. 3b is a right side view of a modular optical package.
Figure 3C:
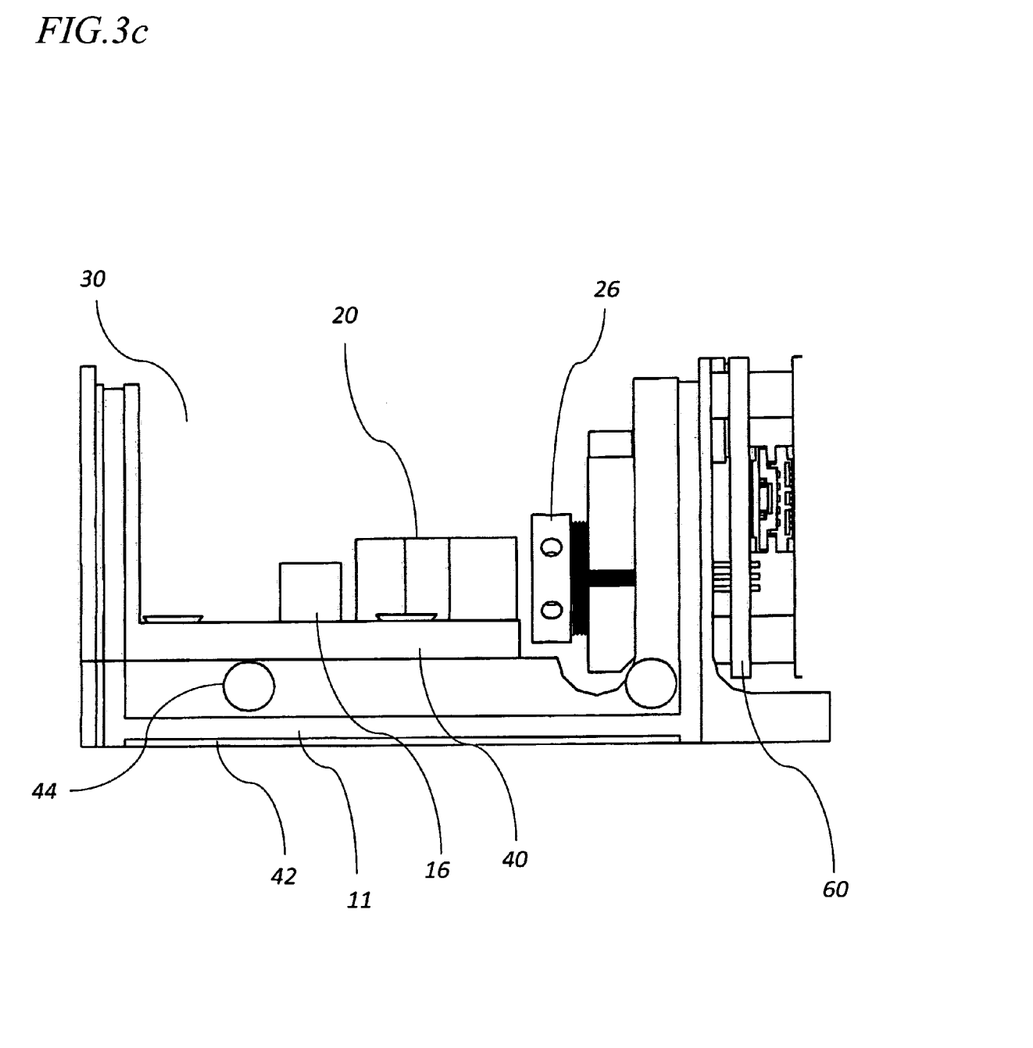
FIG. 3c is a left side view of a modular optical package.
Figure 3D:
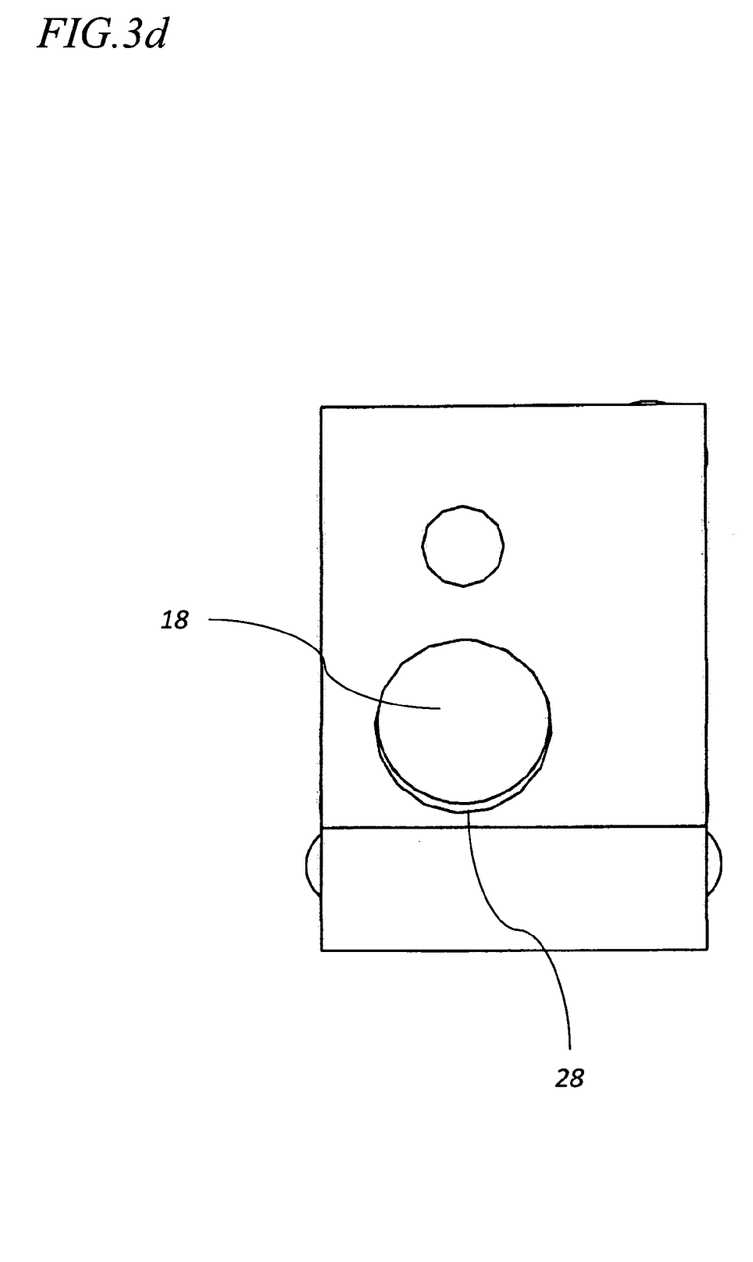
FIG. 3d is a front-end view of a modular optical package.
Figure 3E:
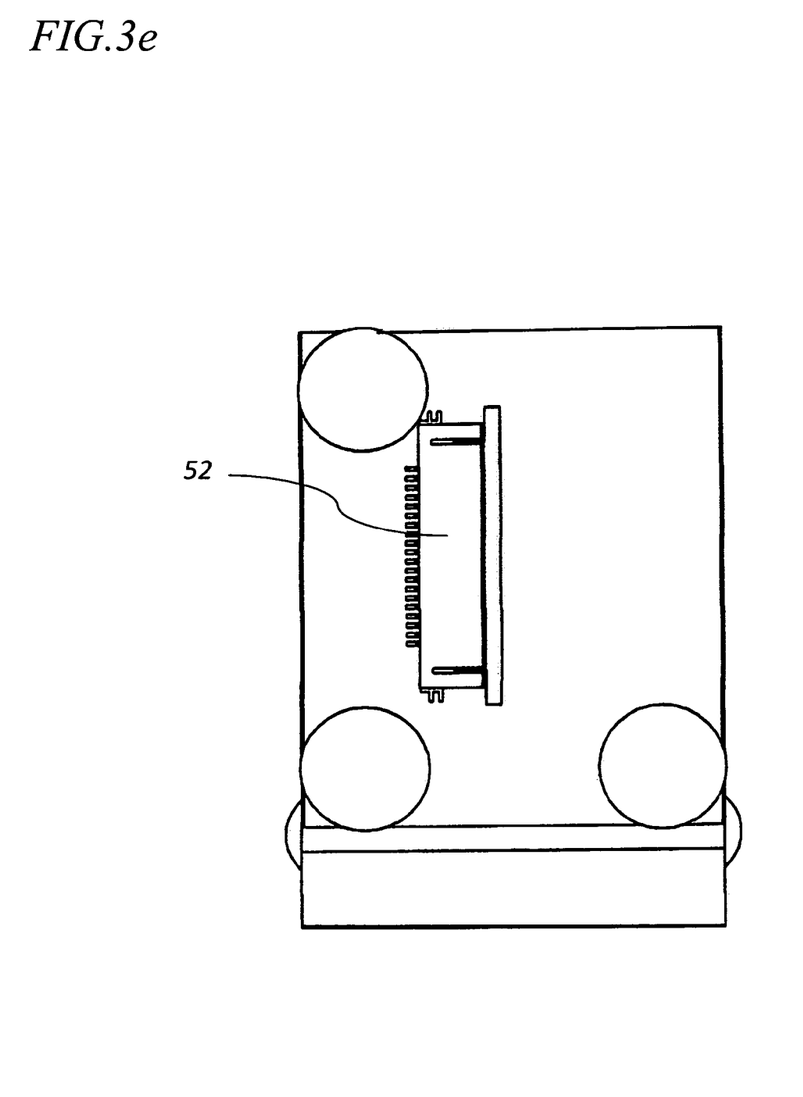
FIG. 3e is a back end view of a modular optical package.
Figure 3F:
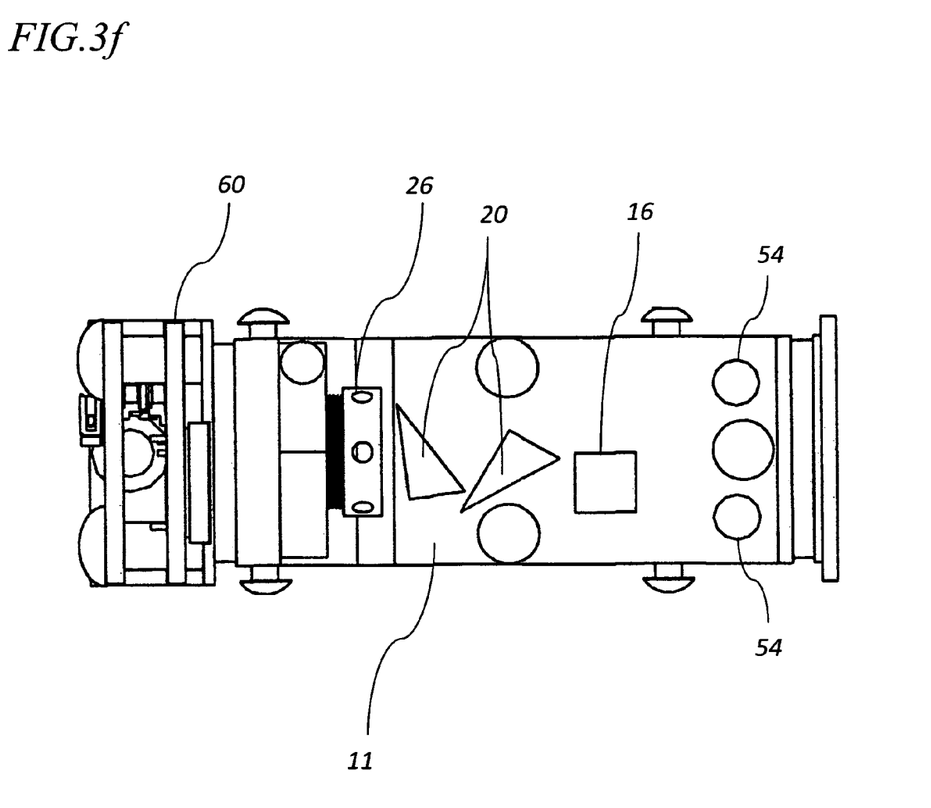
FIG. 3f is a front view of a modular optical package.
Figure 3G:
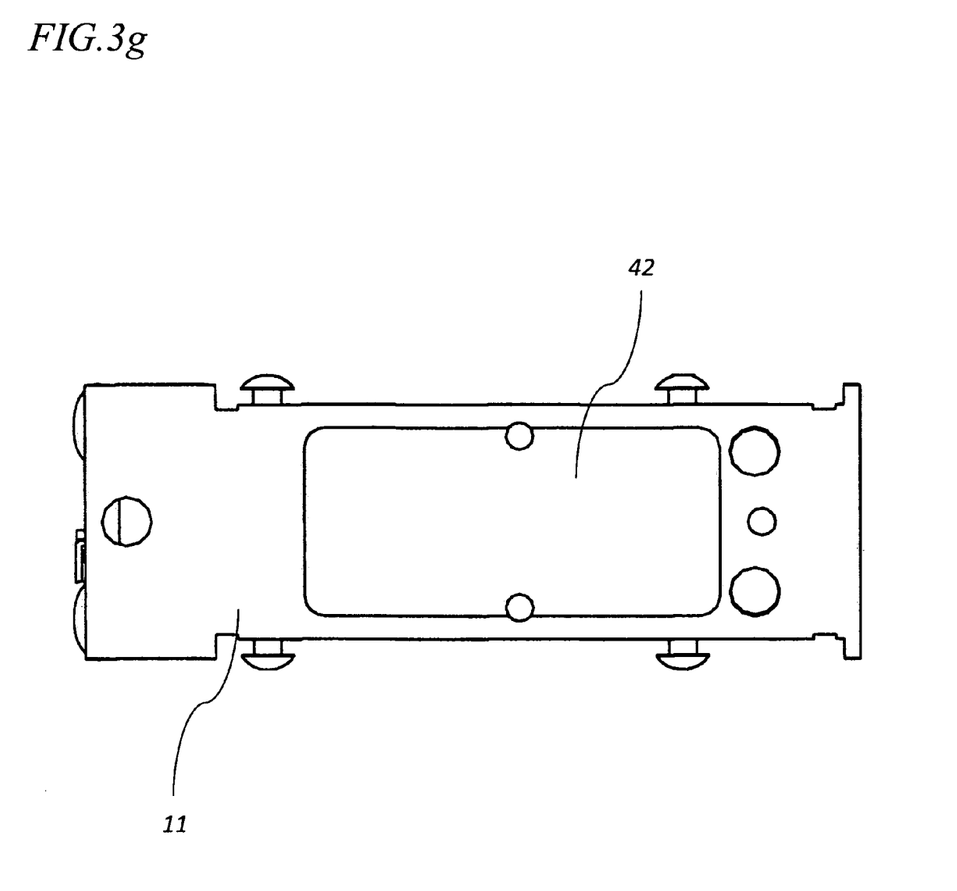
FIG. 3g is a back view of a modular optical package.

In the particular preferred embodiment shown in FIG. 2, a means for effecting dynamic control of the external electromagnetic radiation by measuring a fraction of the radiation coming through the modification pathway. Specifically, a pick-off window 18 is the next in the modification pathway to receive the now circularized coherent beam. The pick-off window 18 is essentially a reflective surface having a predefined level of reflection. Light energy incident on pick-off window 18 will reflect a fraction of the overall beam energy to a separate sensing means (herein depicted as dynamic feedback photodiode 24 in FIG. 3). Depending upon the emission wavelength of coherent source 60 typically from 3 to 5% of the overall beam energy is reflected to dynamic feedback photodiode 24, with the range of 3 to 4% being preferred. The remaining majority of the coherent beam exits a reverse face of the pick-off window 18 and continues through egress portal 28.

Dynamic feedback photodiode 24 is oriented such that the receptor is external to the enclosure space 30 and is exposed to at least a portion of the coherent beam from pick-off window 18. In a preferred embodiment, photodetector 24 has a window which seal the interior aspect of chamber 30 to the exterior of modular optical package 8. The dynamic feedback photodiode 24 may operate through a number of means to control the output of an external electromagnetic radiation source 60, including but not limited to, power modulation, frequency modulation, and/or amplitude modulation. Prior art representing such means of circularization include U.S. Pat. Nos. 4,237,427 to Holland; 5,265,115 to Amano; 6,144,025 to Tei, et al.; 6,765,940 to Short; 7,218,655 to Wang, et al.; and, 7,382,807 to Fairgrieve, et al., each of which is incorporated in its entirety by reference.

Intermediate in the modification pathway pick-off window 18 and egress portal 24, there is shown in FIGS. 2 and 3 (*a-g*) an optional polarization enhancing elements 16. Said polarization enhancing element 16 can include one or more filter elements which may affect the transmitted electromagnetic radiation attribute in one or more variables, including but not limited to; polarization, amplitude, and patterning. Relevant teachings are provided by: "Distributed Feedback Laser Diodes and Optical Tunable Filters", Ghafouri-Shiraz, Wiley Publishing 2003, ISBN 0470856181; "Thin Film Optical Filters", MacLeod, Taylor & Francis Publishing 2001, ISBN 0750306882; and "Lasers and Electro-optics: Fundamentals and Engineering", Davis, Cambridge University Press 1996, ISBN 0521484030, each of which is incorporated in its entirety by reference.

Referring to FIG. 2, therein is depicted thermal control unit 40. Thermal control unit 40 is a dynamically controlled temperature management system, which allows for enclosure space 30, and the optical elements located therein, to achieve and maintain a desired microenvironment temperature. The primary elements of thermal control unit 40 include thermal sensor 44, thermal control circuit 46, and heating/cooling element 42. Heating/cooling element 42 is preferably mounted to block 50 and is in at least partial contact with enclosure base 11 when the modular optical package 8 is affixed or otherwise in contact with mounting block 50. Thermal sensor 44 and heating/cooling element 42 are in electronic communication with thermal control circuit 46 such that input from thermal sensor 44 feeds into thermal control circuit 46 and output from logic elements contained with thermal control circuit 46 indicate to heating/cooling element whether to increase or decrease the temperature thereof. Thermal control circuit 46 can operate by any number of suitable comparator or reference logic mechanisms such that temperature of the enclosure space 30 is controlled within desired levels, wherein the desired levels are set by the user, are predefined at the time of manufacture, or are defined dynamically by either the associated electromagnetic radiation source 60 or by the associated equipment utilizing the output from the modification pathway. In addition, thermal control circuit 46 may be in further electronic communication with a control circuit involving dynamic feedback photodiode 24 such that temperature is a further control variable for the operation of an external electromagnetic radiation source 60. Thermal sensor 44 may include any suitable device, such as exemplified by a thermistor type resistor. Heating/cooling element 42 is preferably chosen from the family of thermoelectric coolers, such as a Peltier-type device, for ease of manufacture and maintenance. In the alternative, recirculation-based loops containing thermal conductive media and a separate temperature-affecting unit may be employed. Supplemental thermal conductive elements and compounds, such as heat pipes, heat sinks, and thermal doping or greases, may be used to improve operational efficiencies and to optimize the functional footprint of the device. Prior art representing such means of suitable thermal control devices and circuits include U.S. Pat. Nos. 4,901,324 to Martin; 5,181,214 to Berger, et al.; 5,253,260 to Palombo; 7,344,279 to Meuller, et al; and Published US Patent Applications No.'s: 2004055917 to Sotozaki, et al.; and, 2005109041 to Tanaka each of which is incorporated in its entirety by reference.

The modular optical package 8 (e.g. coherent light beam emitter), can be removed for repair or replacement, without having to remove any other componentry such as the control circuitry. Integral to, are durably affixed with, modular optical package 8 are two fixture elements; mounting block 50 and quick connect 52. The modulator optical package 8, once removed from mounting block 50, can then be subsequently reattached to the instrument. The alignment of electromagnetic radiation source 60 from egress port 28 is highly repeatable by the precision mounting and alignment through use of various geometries. Mount block 50 includes specific geometries that are orientation specific, thereby mating into corresponding base profile geometries associated with the primary electromagnetic radiation source 60. Suitable geometries include one or more continuous or discontinuous profiles, including but not limited to grooves, key-ways, posts, slots, ribs, tongue and grooves, and the combinations thereof. Associated with said mounting block 50 is at least one retention mechanism 54. Retention mechanism 54 acts either upon the mounting geometry profile or upon a separate region of retention block 50 to maintain modular optical package 8 in a fixed position once engaged. Suitable retention mechanisms 54 include but not limited to threaded, pinned, snapped, clipped, or spring-loaded fixtures. Optionally, associated with mounting block 50 is quick connect 52. Quick connect 52 includes all connections, electronic or otherwise, related to the operation of the modular optical package 8 relative to the control circuitry contained elsewhere than on the modular optical package 8 itself.

From the foregoing, it will be observed that numerous modifications and variations can be affected without departing from the true spirit and scope of the novel concept of the present invention. It is to be understood that no limitation with respect to the specific embodiments illustrated herein is intended or should be inferred. The disclosure is intended to cover, by the appended claims, all such modifications as fall within the scope of the claims.

The invention claimed is:

1. A modular optical package comprising;
  a. an enclosure having at least one ingress portal at least one egress portal, an enclosure case and an enclosure base;
  b. a beam circularization element within said enclosure;
  c. at least one retention mechanism in said enclosure base;
  wherein said enclosure case and enclosure base form an enclosure space specific to said beam circularization element contained therein;
  wherein said ingress and egress portals are capable of transmitting electromagnetic radiation through said enclosure space; and
  wherein said retention mechanism allows said enclosure base to be affixed to a separate mounting block comprising an electromagnetic radiation source so as to maintain said modular optical package in a fixed position relative to said electromagnetic radiation source such that when said mounting block and said retention mechanism are engaged, said ingress portal, egress portal and circularization element form an optical modification pathway relative to said electromagnetic radiation source in said mounting block.

2. A modular optical package as in claim 1, wherein said modular optical package further includes a thermal control unit affixed thereto.

3. A method for using a modular optical package comprising;
  a. a modular optical package comprising;
    i. an enclosure having at least one ingress portal, at least one egress portal, an enclosure case and an enclosure base;
    ii. a circularization element within said enclosure;
    iii. at least one retention mechanism in said enclosure base;
  b. an electromagnetic radiation source having a mounting block compatible with said retention mechanism of said modular optical package;
  wherein said ingress and egress portals of said modular optical package are capable of transmitting electromagnetic radiation there through; and
  wherein said retention mechanism allows said enclosure base to be affixed to said mounting block such that said ingress portal, egress portal and circularization element form an optical modification pathway; and
  upon activation of said electromagnetic radiation source, said radiation is conducted through and modified by said modular optical package.

4. A modular optical package as in claim 3, wherein said modular optical package further includes a thermal control unit affixed thereto.

* * * * *